(12) United States Patent
Huang et al.

(10) Patent No.: US 8,268,537 B2
(45) Date of Patent: Sep. 18, 2012

(54) METHOD FOR MANUFACTURING PRINTED CIRCUIT BOARD

(75) Inventors: Pai-Hung Huang, Taoyuan (TW);
 Chih-Kang Yang, Taoyuan (TW);
 Cheng-Hsien Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 830 days.

(21) Appl. No.: 12/332,321

(22) Filed: Dec. 10, 2008

(65) Prior Publication Data
 US 2009/0260867 A1    Oct. 22, 2009

(30) Foreign Application Priority Data
 Apr. 18, 2008  (CN) .......................... 2008 1 0301211

(51) Int. Cl.
 *G03F 7/20*    (2006.01)

(52) U.S. Cl. ........................................ 430/319; 430/394
(58) Field of Classification Search .................. 430/313, 430/319, 312, 394
 See application file for complete search history.

(56) References Cited

U.S. PATENT DOCUMENTS 5,240,746 A * 8/1993 O'Connell Litteral ....... 427/510
5,436,062 A * 7/1995 Schmidt et al. ............... 428/209

* cited by examiner

*Primary Examiner* — Brittany Raymond
(74) *Attorney, Agent, or Firm* — Altis Law Group, Inc.

(57) ABSTRACT

A printed circuit board substrate includes a metal-clad substrate and a number of N spaced circuit substrates arranged on the metal-clad substrate along an imaginary circle, N is a natural number greater than 2. The circuit substrates are equiangularly arranged about the center of the circle, and each of the circuit substrates is oriented 360/N degrees with respect to a neighboring printed circuit board.

11 Claims, 20 Drawing Sheets

METHOD FOR MANUFACTURING PRINTED CIRCUIT BOARD

BACKGROUND

1. Technical Field

The present invention relates to printed circuit boards, particularly to a printed circuit board substrate and a method for manufacturing a batch of printed circuit boards.

2. Description of Related Art

Rigid-flexible printed circuit boards (R-F PCBs) are widely used in electronic devices. Rigid-flexible printed circuit board has a rigid region and a flexible region. The rigid region is configured for assembling electronic components and maintaining electrical connections among the electronic components. The flexible region is connected to the rigid region and can be bent relative to the rigid region. Thus, the rigid-flexible printed circuit board can be assembled with a number of electronic components, and occupies small space by bending the flexible region.

A typical method for manufacturing a batch of rigid-flexible printed circuit boards is shown in FIGS. 13-17. As shown in FIG. 13 and FIG. 14, a rigid-flexible printed circuit board substrate 30 includes a rigid substrate 31 and three flexible substrates 32 laminated thereon. The rigid substrate 31 includes a resin layer 311 and a copper layer 312 configured to form predetermined electrically conductive patterns on the resin layer 311. The rigid-flexible printed circuit board substrate 30 defines three processing regions 310, each of corresponds to a flexible substrate 32. Each of the flexible substrates 32 includes an insulation layer 321 and a plurality of electrical traces 322 formed thereon. As shown in FIG. 15 and FIG. 16, a photolithographic process is performed to make a predetermined electrically conductive patterns from the copper layer 312 on the resin layer 311.

The photolithographic process is described in detail as following. Firstly, referring to FIG. 15, a photoresist layer 40 is applied on the copper layer 312 and covers the three processing regions 310. Secondly, the photoresist layer 40 is exposed by UV-light passing through a photo mask 50. The photo mask 50 has three exposing sections 51, each of which has pattern-like openings 510 defined therein. Thirdly, referring to FIG. 16, the photoresist layer 40 is developed, the copper layer 312 is etched to form predetermined electrically conductive patterns 312a, and the residual photoresist layer 40 is removed. After the photolithographic process, plated through holes (not shown) are formed in the rigid-flexible printed circuit board substrate 30 to interconnect the electrically conductive patterns 312a and the electrical traces 322 of the flexible substrates 32. Then the rigid-flexible printed circuit board substrate 30 is cut along imaginary boundary lines between the manufacturing regions 310, and three rigid-flexible printed circuit boards 60 are obtained as shown in FIG. 17.

In the photolithographic process, the photo mask 50 should be precisely aligned with the rigid substrate 31 when the photoresist layer 40 is exposed because the electrical traces 322 of the flexible circuit board 32 should be corresponding to the electrically conductive patterns 312a of the rigid substrate 31. If the photo mask 50 deviates from desired position, the electrical conductive patterns 312a would not align with the electrical traces 322 and could not be electrically connected to the electrical traces 322 by plated through holes, thereby a quality of the batch of rigid-flexible printed circuit boards 60 is affected.

What is needed, therefore, is a method for manufacturing a batch of printed circuit boards which can overcome the above-described problems.

SUMMARY

In one aspect, a method for manufacturing printed circuit boards is provided. The method includes: providing a printed circuit board substrate including a metal-clad substrate and multiple spaced circuit substrates, $\{M_i\}$, i=1, 2, . . . , N, N being an integer greater than 2, the circuit substrates, $\{M_i\}$, mounted on the metal-clad substrate along an imaginary circle, the circuit substrates being equiangularly arranged about the center of the circle, the i+1th circuit substrate, $M_{i+1}$, being oriented 360/N degrees with respect to the ith neighboring circuit substrate, $M_i$; defining multiple processing regions, $\{K_i\}$, i=1, 2, . . . , N, N being an integer greater than 2, on the metal-clad substrate, the processing regions, $\{K_i\}$, spatially corresponding to the respective circuit substrates, $\{M_i\}$; forming a photoresist layer on an opposite side of the metal-clad substrate to the circuit substrates, the photoresist layer including multiple photoresist layer sections, $\{P_i\}$, i=1, 2, . . . , N, N being an integer greater than 2, the photoresist layer sections, $\{P_i\}$, respectively located at the processing regions, $\{K_i\}$; exposing the ith photoresist layer section, $P_i$, which spatially corresponds to the ith circuit substrate, $M_i$; rotating the printed circuit board substrate an angle of 360/N degrees about the center of the circle; exposing the i+1th photoresist layer section, $P_{i+1}$, which is proximate to the ith photoresist layer section, $P_i$, and spatially corresponds to the i+1th circuit substrate, $M_{i+1}$; developing the ith photoresist layer section, $P_i$; etching the metal-clad substrate at the ith processing region, $K_{i+1}$, to form electrically conductive patterns thereon; developing the i+1th photoresist layer section, $P_{i+1}$; and etching the metal-clad substrate at the i+1th processing region, $K_{i+1}$, to form electrically conductive patterns thereon; wherein in the method, the ith and i+1th photoresist layer sections, $P_i$ and $P_{i+1}$, are formed simultaneously; but the ith photoresist layer section, $P_i$, is exposed prior to that of the i+1th photoresist layer section, $P_{i+1}$.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below with reference to the drawings.

Figure 1:
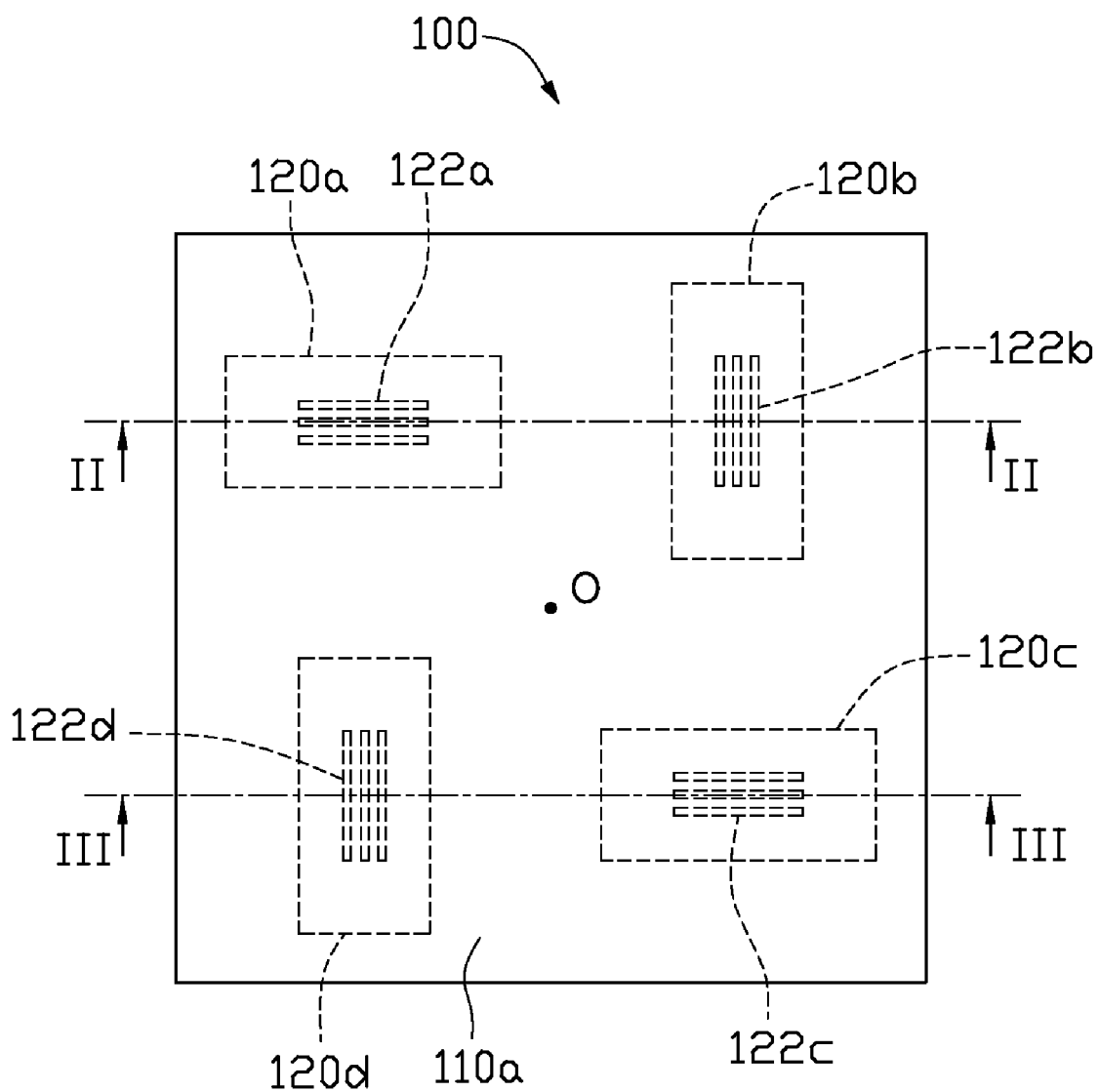
FIG. 1 is a top view of a printed circuit board substrate, the printed circuit board substrate includes four circuit substrates.
Figure 2:
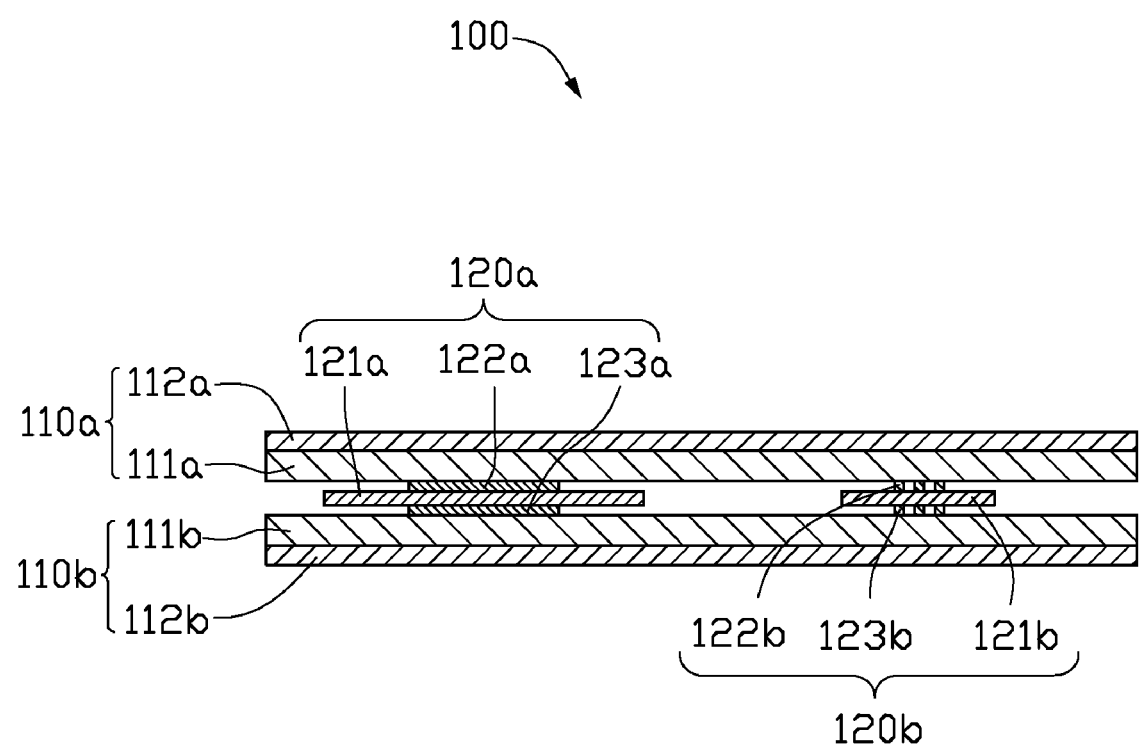
FIG. 2 is a sectional view of the printed circuit board substrate along line II-II of FIG. 1, showing the printed circuit board substrate further includes a first metal-clad substrate and a second metal-clad substrate.
Figure 3:
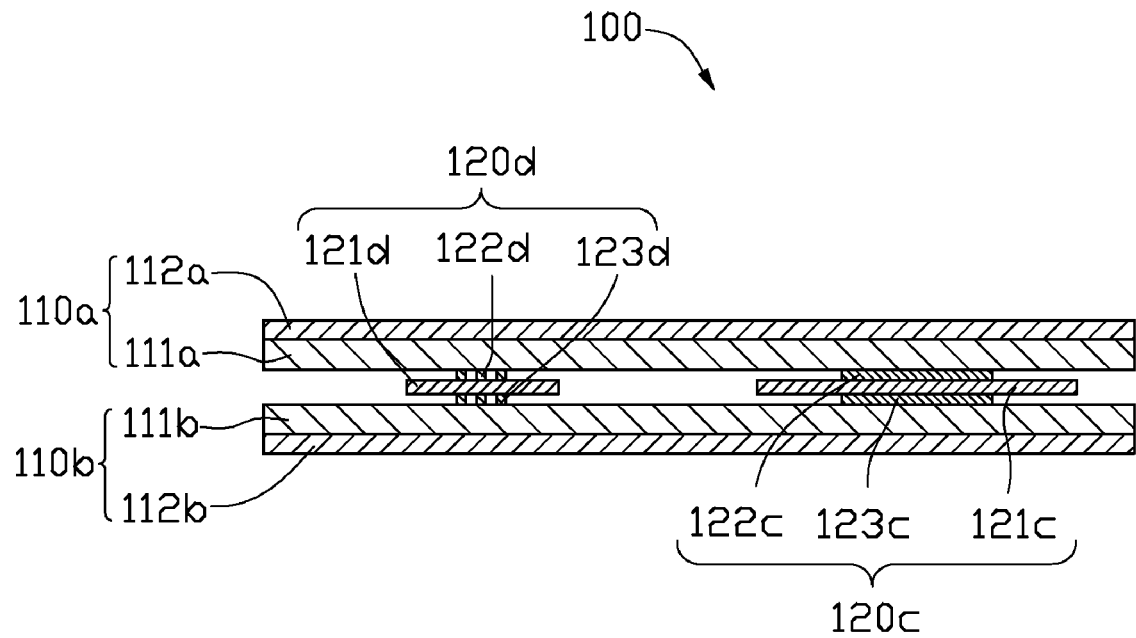
FIG. 3 is a sectional view of the printed circuit board substrate along line III-III of FIG. 1.

Referring to FIGS. 1-3, a printed circuit board substrate 100 includes a first metal-clad substrate 110a, a second metal-clad substrate 110b, and four circuit substrates, i.e., a first circuit substrate 120a, a second circuit substrate 120b, a third circuit substrate 120c, and a fourth circuit substrate 120d.

The first metal-clad substrate 110a includes a first insulation layer 111a and a first electrically conductive layer 112a. The insulation layer 111a is configured for supporting the electrically conductive layer 112a. The electrically conductive layer 112a is formed on the insulation layer 111a, and is fit to form electrically conductive patterns in a subsequent process. The first substrate 110a has a rotation center denoted as O in the FIG. 1, and can coincide with itself by rotating an angle less than 360 degrees about the rotation center O. In the illustrated embodiment, the first metal-clad substrate 110a is in the shape of a square, and can coincide with itself by rotating 90, 180 or 270 degrees about the rotation center O.

The second metal-clad substrate 110b has a structure mating with the first metal-clad substrate 110a. The second metal-clad substrate 110b includes a second insulation layer 111b opposite to the first insulation layer 111a and a second electrically conductive layer 112b formed on the insulation layer 111b.

The first circuit substrate 120a, the second circuit substrate 120b, the third circuit substrate 120c, and the fourth circuit substrate 120d have an identical structure. The first circuit substrate 120a is a double-sided copper clad laminate, and includes a first dielectric layer 121a, a plurality of first electrical traces 122a (as an example, three parallel first electrical traces 122a shown as dash lines in FIG. 1) and a plurality of second electrical traces 123a. The first electrical traces 122a are formed on a surface of the dielectric layer 121a, and the second electrical traces 123a are formed on another surface of the dielectric layer 121a opposite to the first electrical traces 122a. In the present embodiment, the first electrical traces 122a and the second electrical traces 123a have the same patterns. Correspondingly, the second circuit substrate 120b includes a second dielectric layer 121b, a plurality of third electrical traces 122b, and a plurality of fourth electrical traces 123b. The third circuit substrate 120c includes a third dielectric layer 121c, a plurality of fifth electrical traces 122c and a plurality of sixth electrical traces 123c. The fourth circuit substrate 120d includes a fourth dielectric layer 121d, a plurality of seventh electrical traces 122d and a plurality of eighth electrical traces 123d.

The circuit substrates 120a, 120b, 120c and 120d are sandwiched between the first metal-clad substrate 110a and the second metal-clad substrate 110b respectively. The first, third, fifth and seventh electrical traces 122a, 122b, 122c and 122d are in intimate contact with the first insulation layer 111a of the first metal-clad substrate 110a. The second, fourth, sixth and eighth electrical traces 123a, 123b, 123c, and 123d are in intimate contact with the second insulation layer 111b of the second metal-clad substrate 110b.

The circuit substrates 120a, 120b, 120c, and 120d are arranged along an imaginary circle, and are equiangularly arranged about the center of the circle. In the illustrated embodiment, said four circuit substrates 120a, 120b, 120c, and 120d are equiangularly arranged about the rotation center O of the first metal-clad substrate 110a. As such, said four circuit substrates 120a, 120b, 120c, and 120d are arranged centrosymmetric with respect to the rotation center O of the first metal-clad substrate 110a.

Additionally, each of the four circuit substrates 120a, 120b, 120c, and 120d is oriented 90 degrees with respect to a neighboring circuit substrate. The first circuit substrate 120a is oriented 90 degrees with respect to the second circuit substrate 120b, the second circuit substrate 120b is oriented 90 degrees with respect to the third circuit substrate 120c, the third circuit substrate 120c is oriented 90 degrees with respect to the fourth circuit substrate 120d, and the fourth circuit substrate 120d is oriented 90 degrees with respect to the first circuit substrate 120a. Thus, the first circuit substrate 120a can coincide with the second circuit substrate 120b by rotating 90 degrees about the rotation center O of the first metal-clad substrate 110a, can coincide with the third circuit substrate 120c by rotating 180 degrees about the rotation center O, and can coincide with the fourth circuit substrate 120d by rotating 270 degrees about the rotation center O.

It is noted that the second metal-clad substrate 110b may not be necessary in the printed circuit board substrate 100. That is, the printed circuit board substrate 100 may only include the first metal-clad substrate 110a and the four circuit substrates 120a, 120b, 120c and 120d.

It is also noted that the number of the circuit substrates is not limited to be four, less or more may be included in the printed circuit board substrate 100 according to practical need. Denoting the number of the circuit substrates as N, N representing a natural number greater than 2, the circuit substrates should be arranged on the first metal-clad substrate 110a along an imaginary circle, equiangularly arranged about the center of the circle, and each of the circuit substrates should be oriented 360/N degrees with respect to a neighboring circuit substrate.

The metal-clad substrates 110a, 110b, and the circuit substrates 120a, 120b, 120c and 120d each can be a rigid substrate or a flexible substrate, thus the printed circuit board substrate 100 can be a rigid, flexible, or rigid-flexible substrate for manufacturing a batch of rigid, flexible, or rigid-flexible printed circuit boards respectively.

A method for manufacturing a batch of printed circuit board according to an embodiment will now be described in detail.

The method includes the steps in no particular order of:

(1) providing a printed circuit board substrate including a metal-clad substrate and multiple spaced circuit substrates, $\{M_i\}$, i=1, 2, ..., N, N being an integer greater than 2, the circuit substrates, $\{M_i\}$, mounted on the metal-clad substrate along an imaginary circle, the circuit substrates being equiangularly arranged about the center of the circle, the i+1th circuit substrate, $M_{i+1}$, being oriented 360/N degrees with respect to the ith neighboring circuit substrate, $M_i$;

(2) defining multiple processing regions, $\{K_i\}$, i=1, 2, ..., N, N being an integer greater than 2, on the metal-clad substrate, the processing regions, $\{K_i\}$, spatially corresponding to the respective circuit substrates, $\{M_i\}$;

(3) forming a photoresist layer on an opposite side of the metal-clad substrate to the circuit substrates, the photoresist layer including multiple photoresist layer sections, $\{P_i\}$, i=1, 2, ..., N, N being an integer greater than 2, the photoresist layer sections, $\{P_i\}$, respectively located at the processing regions, $\{K_i\}$;

(4) exposing the ith photoresist layer section, $P_i$, which spatially corresponds to the ith circuit substrate, $M_i$;

(5) rotating the printed circuit board substrate an angle of 360/N degrees about the center of the circle;

(6) exposing the i+1th photoresist layer section, $P_{i+1}$, which is proximate to the ith photoresist layer section, $P_i$ and spatially corresponds to the i+1th circuit substrate, $M_{i+1}$;

(7) developing the ith photoresist layer section, $P_i$;

(8) etching the metal-clad substrate at the ith processing region, $K_i$ to form electrically conductive patterns thereon;

(9) developing the i+1th photoresist layer section, $P_{i-1}$;

(10) etching the metal-clad substrate at the i+1th processing region, $K_{i+1}$ to form electrically conductive patterns thereon.

Referring to FIGS. 1-3, in step (1), the printed circuit board substrate 100 is provided.

Figure 4:
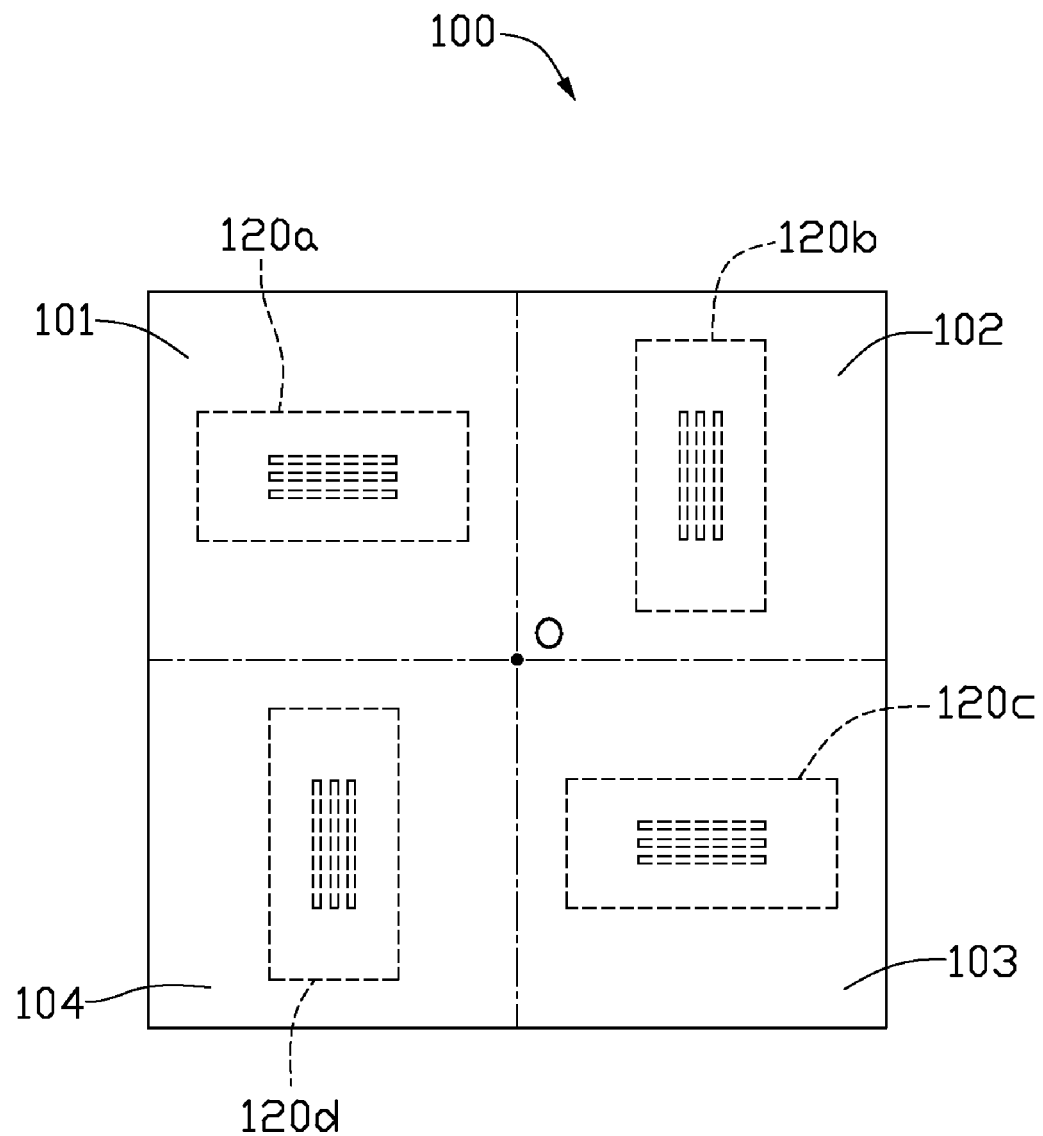
FIG. 4 is similar to FIG. 1, but showing four processing regions defined therein.

Referring to FIG. 4, in step (2), two orthogonal coordinate lines passing through the rotation center O shown as dash dot lines divide the printed circuit board substrate 100 into four symmetrical processing regions, i.e., the first processing region 101, the second processing region 102, the third processing region 103, and the fourth processing region 104. The processing regions 101, 102, 103, and 104 correspond to the circuit substrates 120a, 120b, 120c, and 120d respectively.

Figure 5:
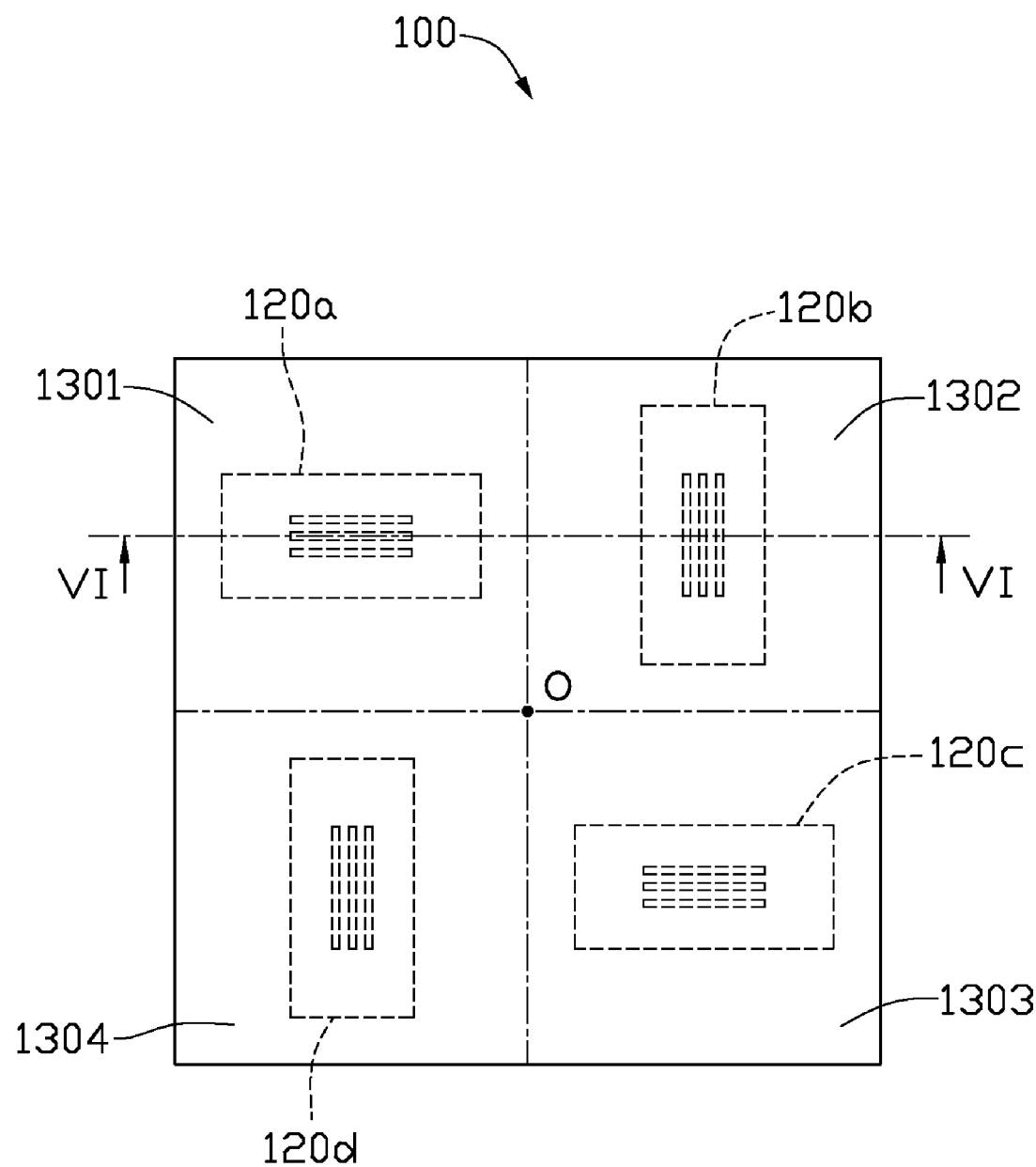
FIG. 5 is similar to FIG. 4, but showing a photoresist layer applied on the first metal-clad substrate of the printed circuit board substrate.
Figure 6:
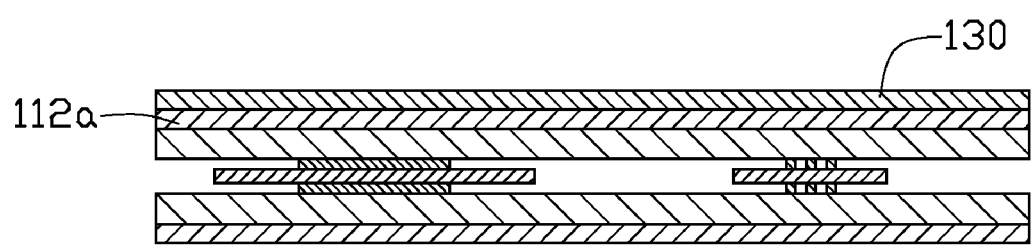
FIG. 6 is a sectional view of the printed circuit board substrate along line VI-VI of FIG. 5.

Referring to FIG. 5 and FIG. 6, in step (3), a photoresist layer 130 is applied on the first electrically conductive layer 112a of the first metal-clad substrate 110a. The photoresist layer 130 includes four photoresist layer sections, i.e., the first photoresist layer section 1301, the second photoresist layer section 1302, the third photoresist layer section 1303, and the fourth photoresist layer section 1304. The photoresist layer sections 1301, 1302, 1303, and 1304 correspond to the processing regions 101, 102, 103, and 104 respectively.

Figure 7:
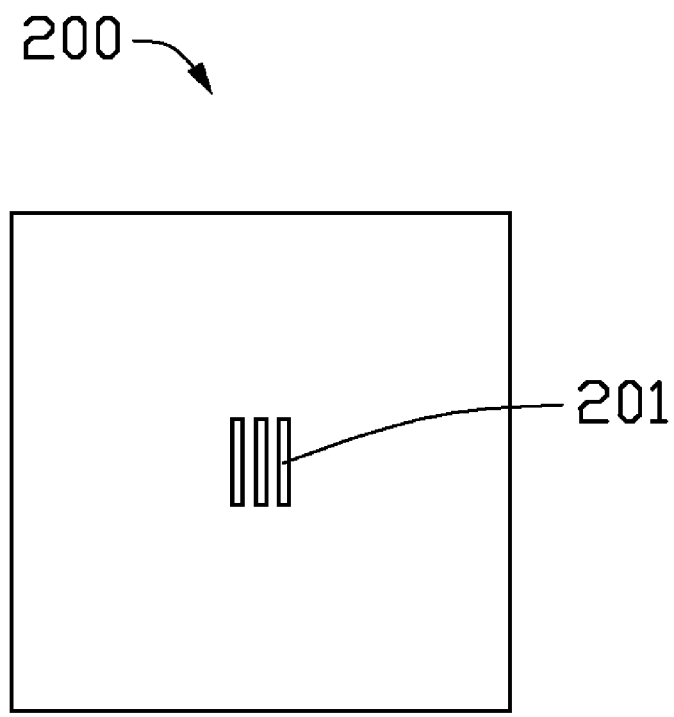
FIG. 7 is a schematic view of a photo mask having a size matched with one processing region defined in the printed circuit board substrate.
Figure 8A:
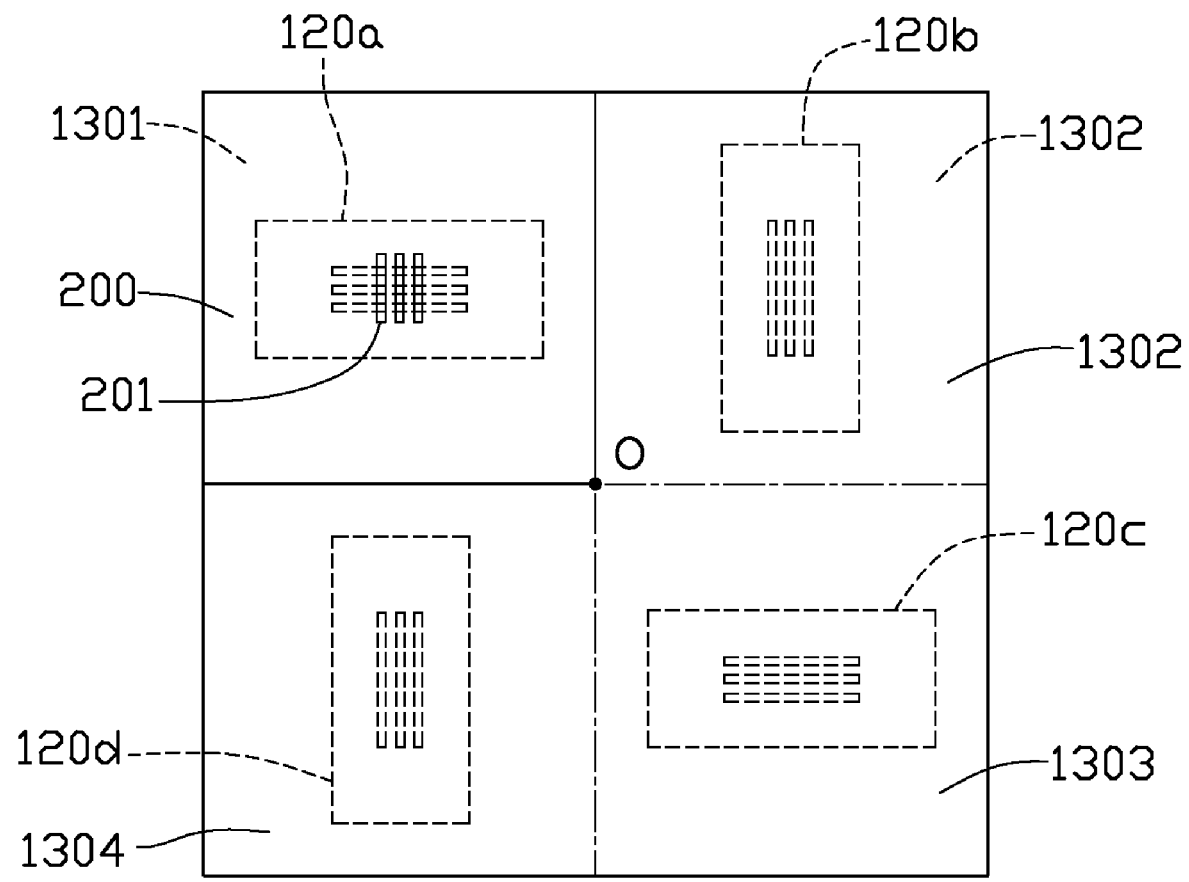
FIGS. 8A-8D are schematic views, showing a process for exposing the photoresist layer.
Figure 8B:
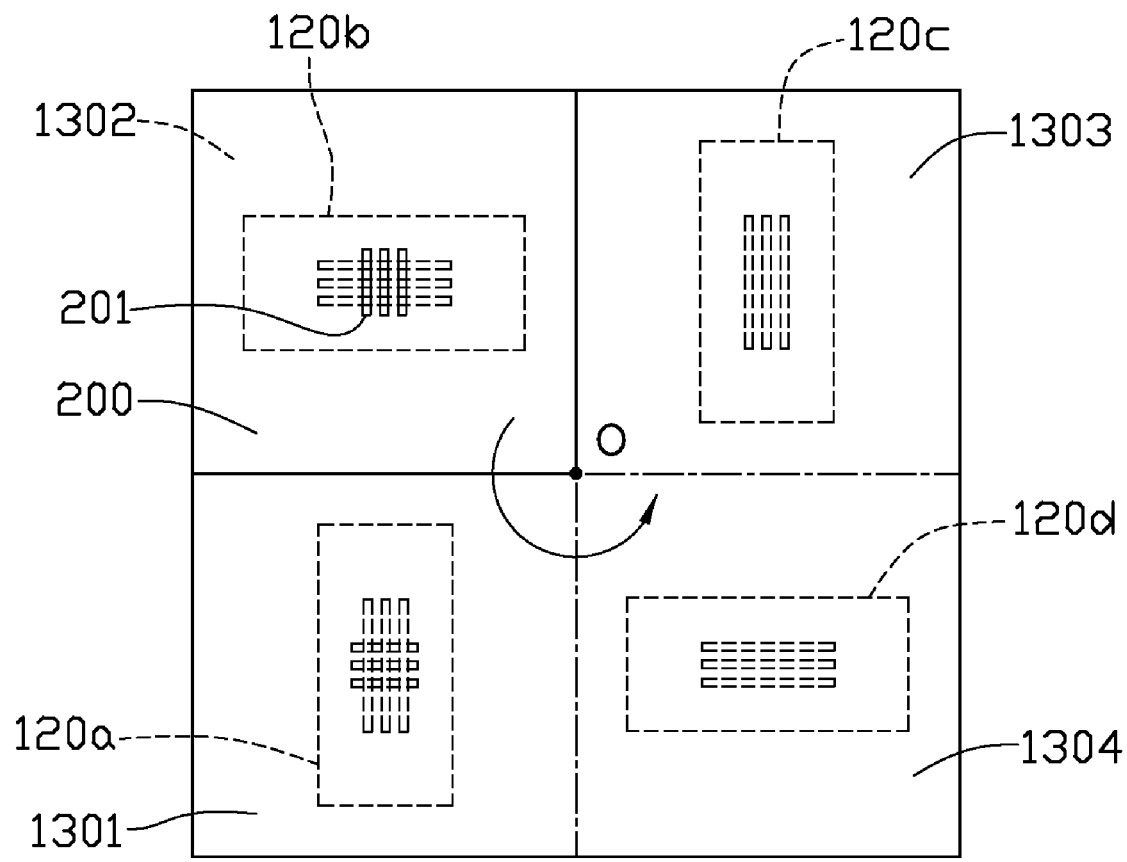
Figure 8C:
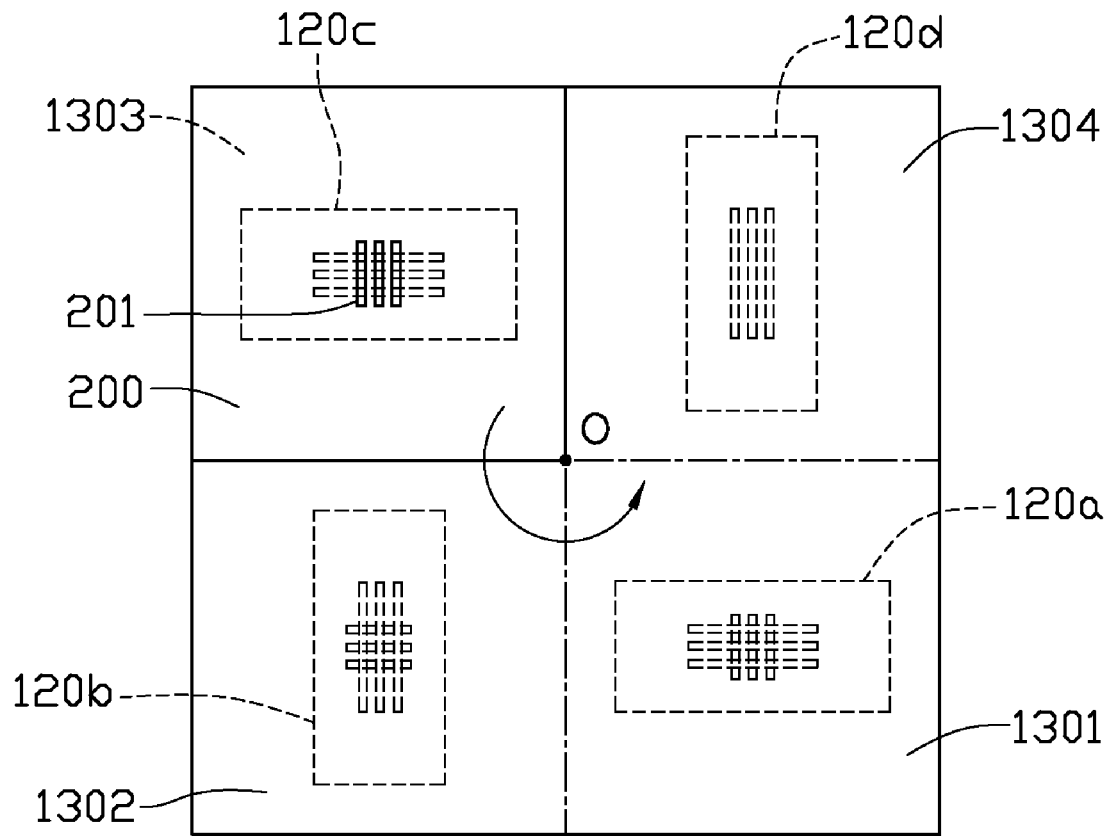
Figure 8D:
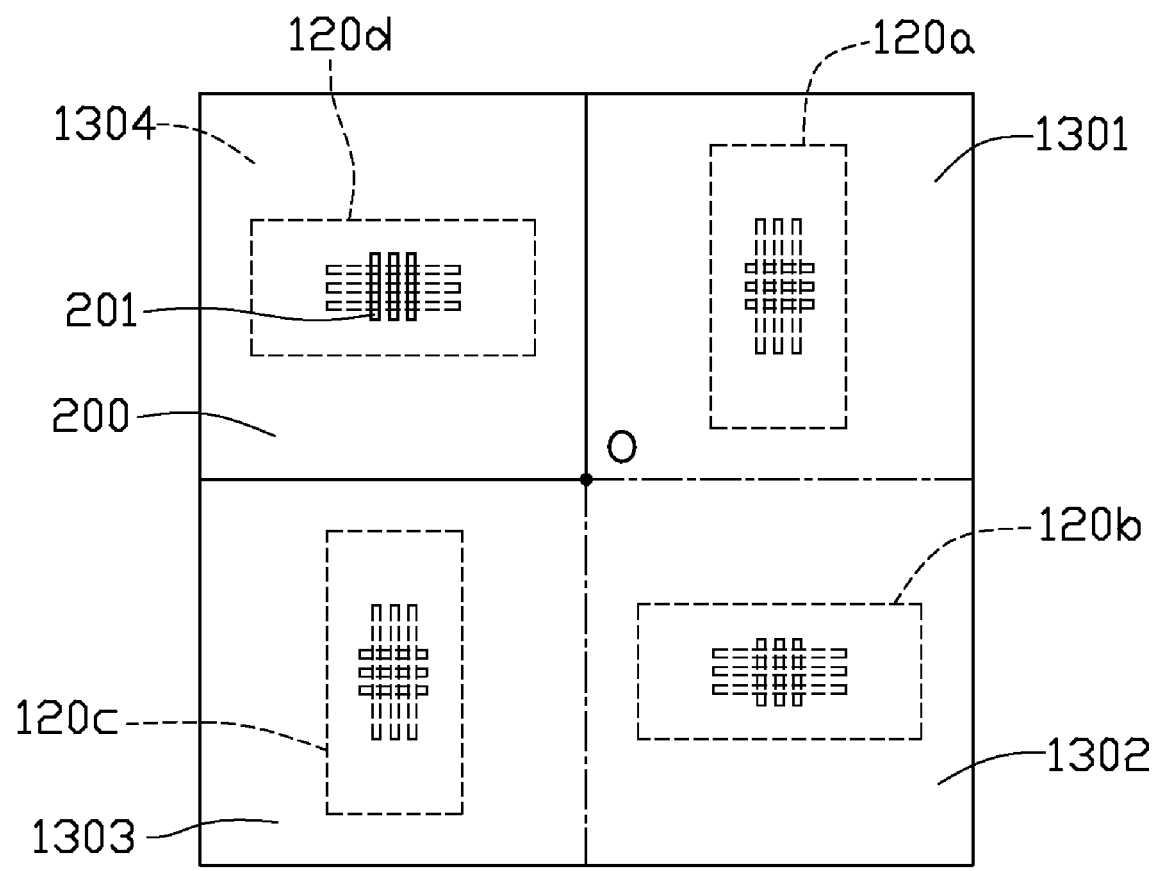
Figure 9:
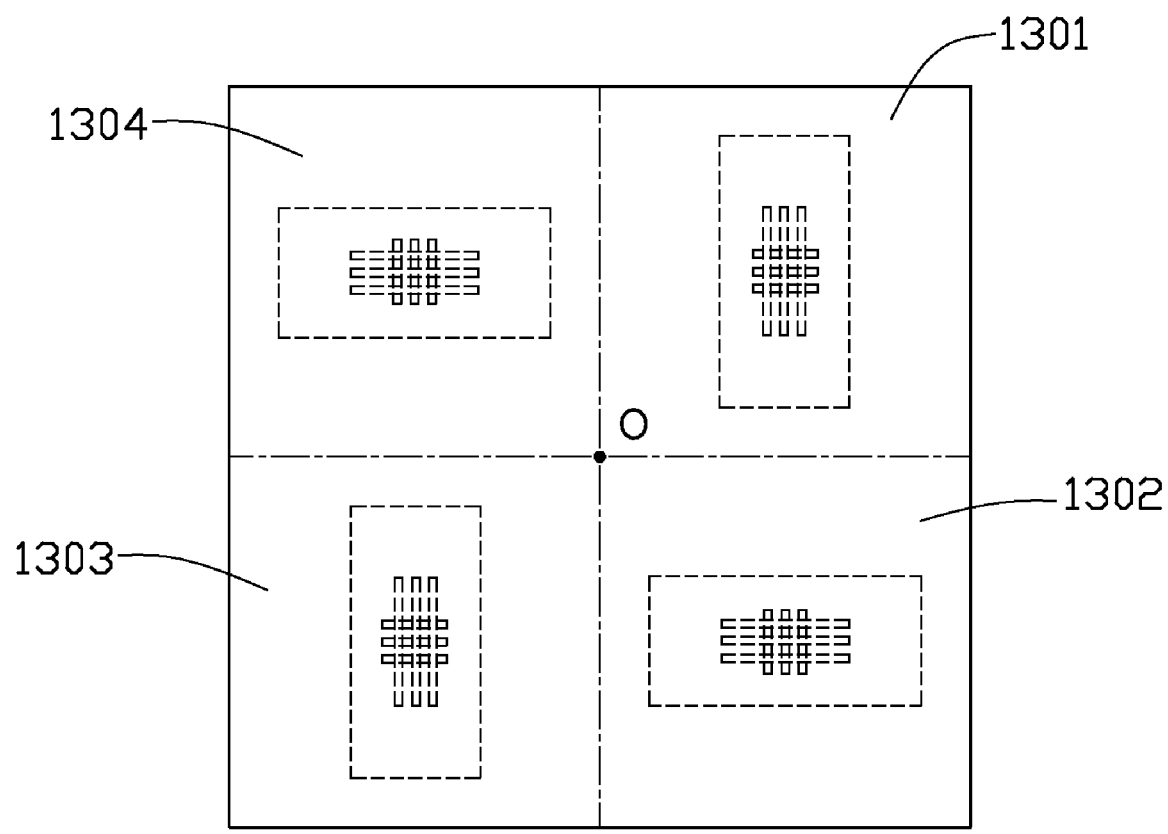
FIG. 9 is similar to FIG. 5, but showing the photoresist layer be exposed completely.

Referring to FIGS. 7-9, in steps (4)-(6), a photo mask 200 having a size similar to one processing region is provided, and the four photoresist layer sections 1301, 1302, 1303, and 1304 are exposed by a light source(not shown) and the photo mask 200 in sequence. The photo mask 200 has pattern-like openings 201 (as an example, three parallel openings 201 as shown in FIG. 7) to pass light (e.g. UV-light) through. The openings 201 correspond to predetermined electrically conductive patterns which will be formed in the first insulation layer 111a using the first electrically conductive layer 112a.

Firstly, referring to FIG. 8A, the photo mask 200 is aligned with the first photoresist layer section 1301.

Secondly, the first photoresist layer section 1301 is exposed to form patterns corresponding to the openings 201.

Thirdly, referring to FIG. 8B, the printed circuit board substrate 100 is rotated 90 degrees in a counterclockwise direction about the rotation center O of the first metal-clad substrate 110a, so that the second photoresist layer section 1302 is aligned with the photo mask 200, and the third circuit substrate 120b is in a position the first circuit substrate 120a located before rotating.

Additionally, precise adjusting of the photo mask 200 may be required to ensure a precise alignment of the second photoresist layer section 1302 and the photo mask 200.

Fourthly, the second photoresist layer section 1302 is exposed to form patterns corresponding to the openings 201.

Fifthly, referring to FIG. 8C, the printed circuit board substrate 100 is rotated 90 degrees again in a counterclockwise direction about the rotation center O, so that the third photoresist layer section 1303 is aligned with the photo mask 200, and the third circuit substrate 120c is in a position the second circuit substrate 120b located before rotating.

Sixthly, the third photoresist layer 1303 is exposed to form patterns corresponding to the openings 201.

Seventhly, referring to FIG. 8D, the printed circuit board substrate 100 is rotated 90 degrees again about the rotation center O of the first metal-clad substrate 110a, so that the fourth photoresist layer section 1304 is aligned with the photo mask 200, and the fourth circuit substrate 120d is in a position the third circuit substrate 120c located before rotating.

Eighthly, the fourth photoresist layer section 1304 is exposed to form patterns corresponding to the openings 201, thus the photoresist layer 130 is completely exposed as shown in FIG. 9.

Figure 10:
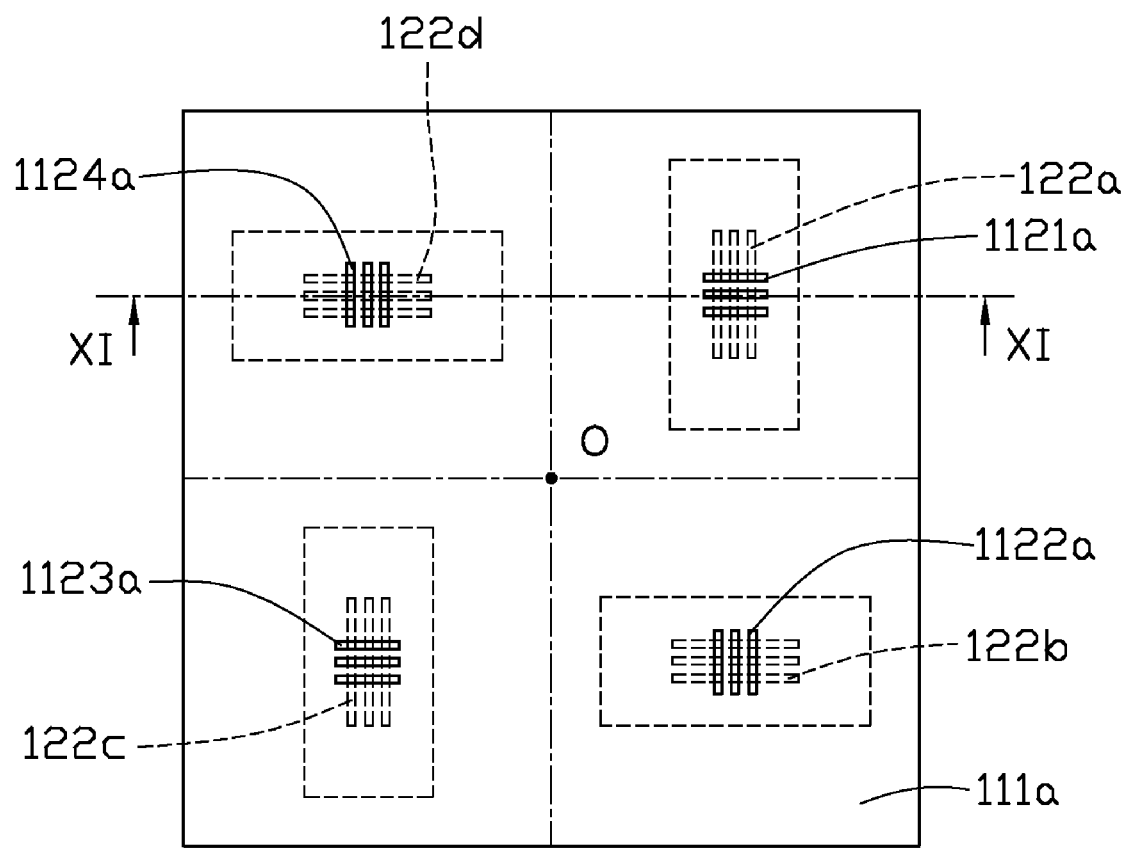
FIG. 10 is similar to FIG. 9, but showing electrically conductive patterns are formed in the first metal-clad substrate.
Figure 11:
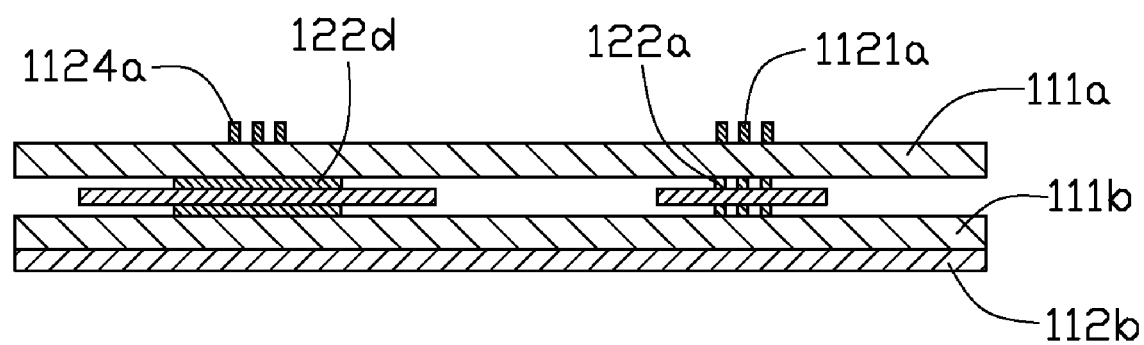
FIG. 11 is a sectional view of the printed circuit board substrate along line XI-XI of FIG 10.

Referring to FIGS. 9-11, in steps (7)-(10), the photoresist layer 130 is developed, the first electrically conductive layer 112a is etched, and the residual photoresist layer 130 is removed, therefore electrically conductive patterns are formed on the first insulation layer 111a using the first electrically conductive layer 112a. In detail, the electrically conductive patterns formed on the first insulation layer 111a include first electrically conductive patterns 1121a corresponding to the first electrical traces 122a, second electrically conductive patterns 1122a corresponding to the third electrical traces 122b, third electrically conductive patterns 1123a corresponding to the fifth electrical traces 122c, and fourth electrically conductive patterns 1124a corresponding to the seventh electrical traces 122d.

It is noted that the photoresist layer sections 1301, 1302, 1303, and 1304 can be developed simultaneously, also can be developed in sequence. The metal-clad substrate also can be etched simultaneously.

Furthermore, a plurality of blind vias can be formed in the printed circuit board substrate 100 to interconnect the first electrically conductive patterns 1121a and the first electrical traces 122a, the second electrically conductive patterns 1122a and the third electrical traces 122b, the third electrically conductive patterns 1123a and the fifth electrical traces 122c, and the fourth electrically conductive patterns 1124a and the seventh electrical traces 122d respectively.

Additionally, electrically conductive patterns are formed on the second insulation layer 111b using the second electrically conductive layer 112b by similar processing steps described above as steps (3)-(10).

Further more, a plurality of plated through holes (not shown) can be formed in the printed circuit board substrate 100 to interconnect the electrically conductive patterns formed on the first insulation layer 111a and the second insulation layer 111b.

Figure 12:
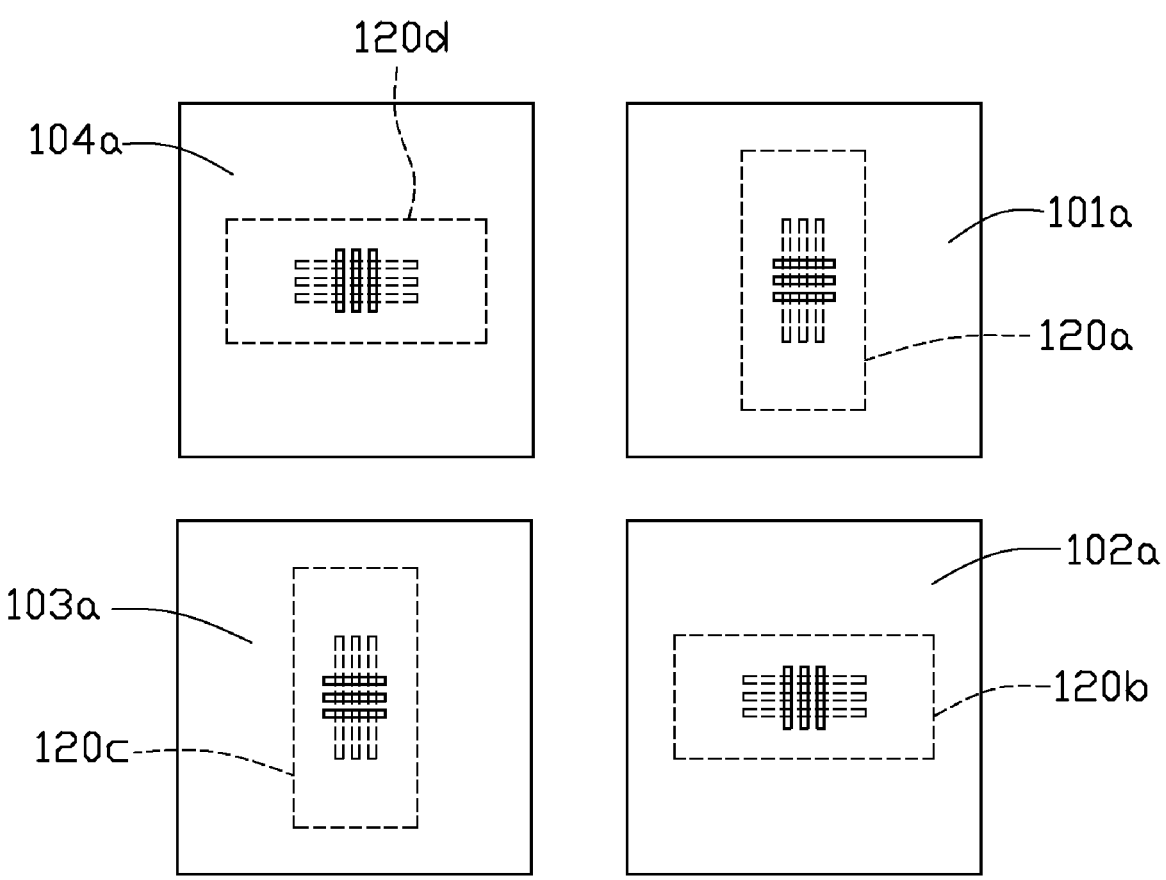
FIG. 12 is a schematic view of four printed circuit boards, which are obtained by cutting the printed circuit board substrate of FIG. 10.
Figure 13:
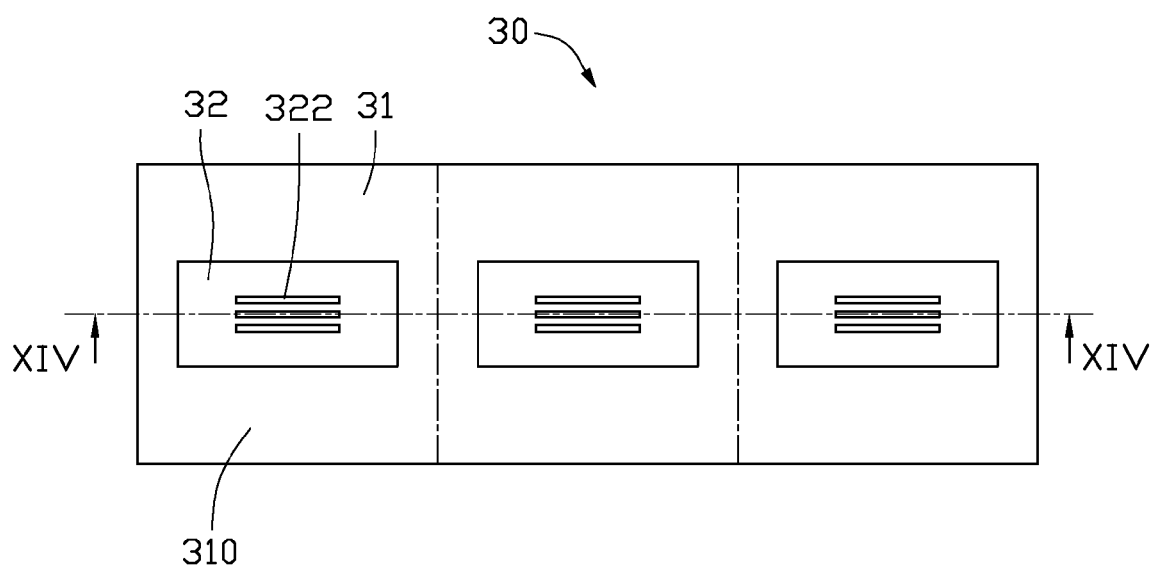
FIG. 13 is a schematic view of a typical rigid-flexible printed circuit board substrate, the rigid-flexible printed circuit board substrate including a rigid substrate and three flexible substrates.
Figure 14:
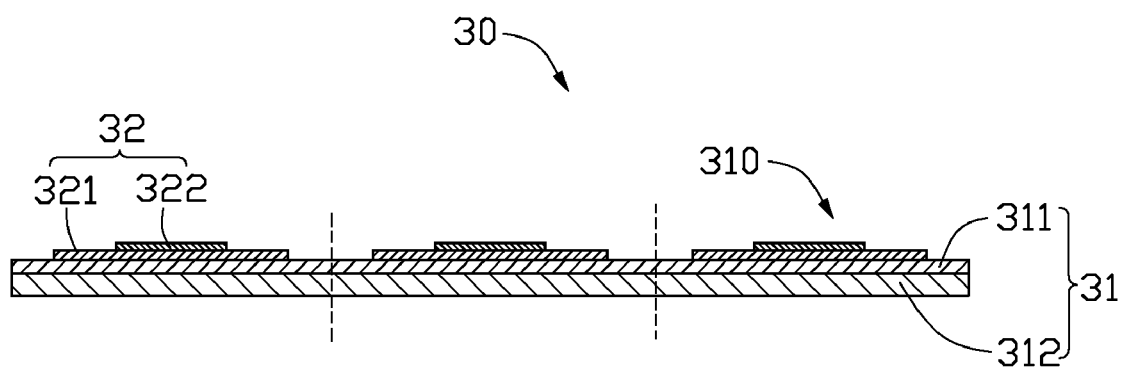
FIG. 14 is a sectional view of the rigid-flexible printed circuit board substrate along line XIV-XIV of FIG. 13.
Figure 15:
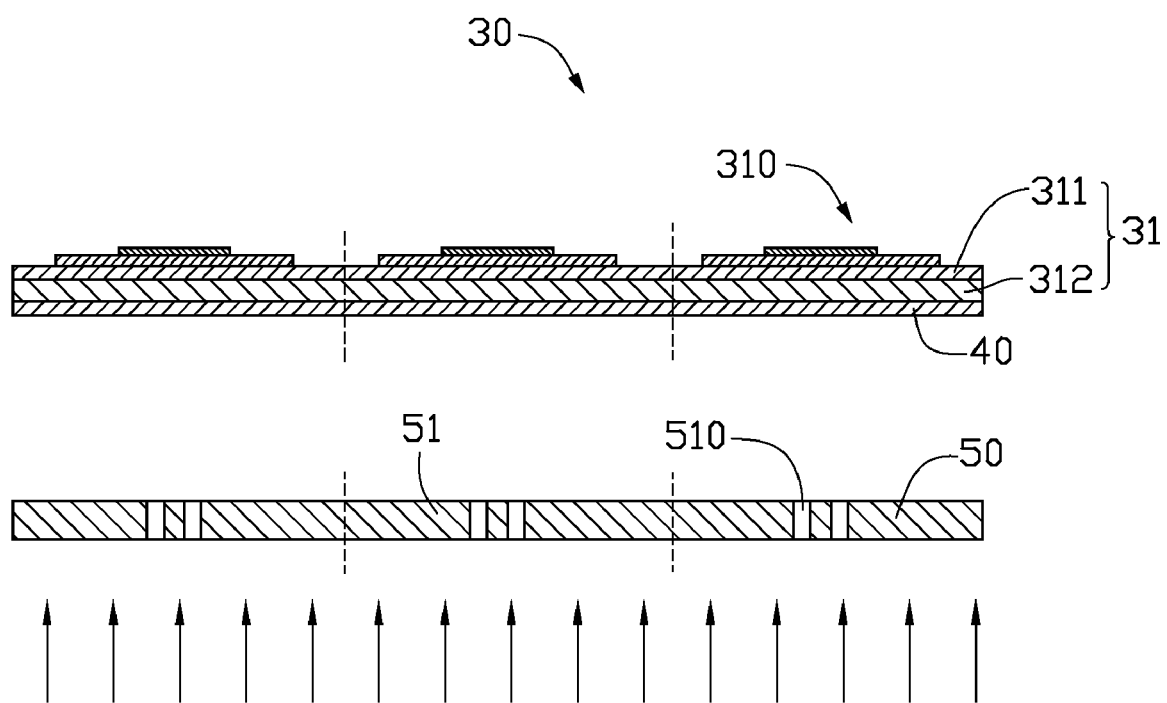
FIG. 15 is similar to FIG. 14, but showing a photoresist layer applied on the rigid substrate is exposed by a photo mask and UV-light.
Figure 16:
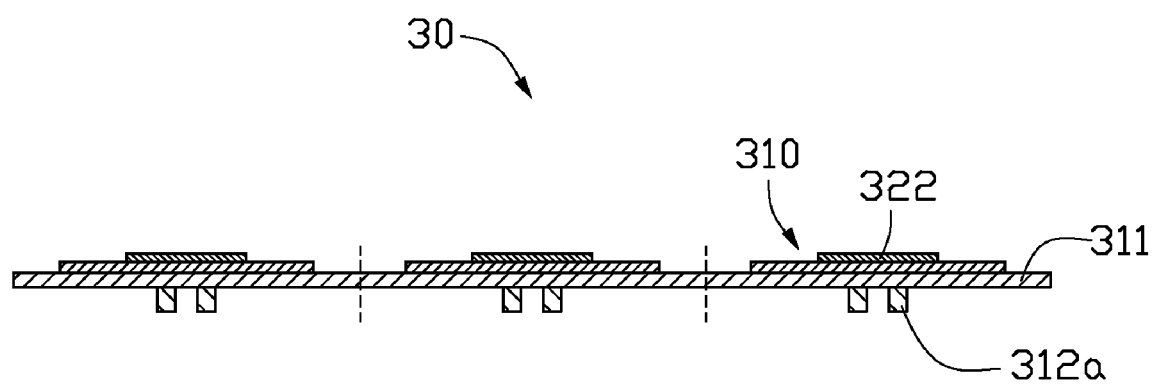
FIG. 16 is similar to FIG. 14, but showing electrically conductive patterns are formed in the rigid substrate.
Figure 17:
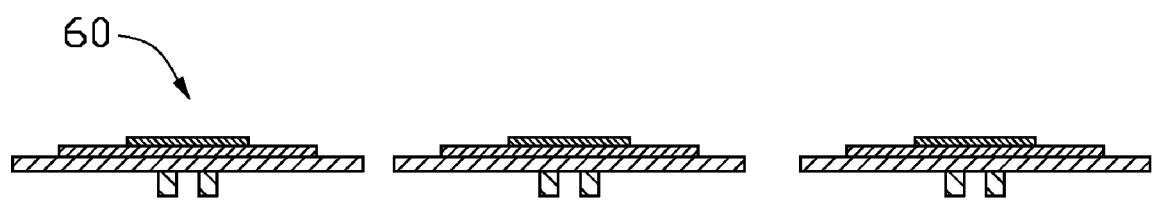
FIG. 17 is a sectional view of three rigid-flexible printed circuit boards, which are obtained by cutting the rigid-flexible printed circuit board substrate shown in FIG. 16.

Referring to FIG. 12, the printed circuit board substrate 100 is cut along imaginary boundary lines between the four processing regions to form four printed circuit board, i.e., a first printed circuit board 101a, a second printed circuit board 102a, a third printed circuit board 103a, and a fourth printed circuit board 104a. The first printed circuit board 101a corresponds to the first processing region 101 and has the first circuit substrate 120a attached thereon. The second printed circuit board 102a corresponds to the second processing region 102 and has the second circuit substrate 120b attached thereon. The third printed circuit board 103a corresponds to the third processing region 103 and has the third circuit substrate 120c attached thereon. The fourth printed circuit board 104a corresponds to the fourth processing region 104 and has the fourth circuit substrate 120d attached thereon.

Furthermore, coverlayers (not shown) can be covered on the printed circuit boards 101a, 102a, 103a, and 104a to protect the electrically conductive patterns formed on the first and second insulation layers 111a, 111b.

In the method, the four photoresist layer sections 1301, 1302, 1303, and 1304 are exposed sequentially, therefore, if one of the photoresit layer section is not aligned with the photo mask 200, the alignment of other photoresit layer sections and the photo mask 200 would not be effected. Thus, the yield rate of manufacturing a batch of printed circuit boards is decreased than prior art manufacturing methods. In addition, by rotating the printed circuit board substrate 100, mass production of the printed circuit boards can be achieved.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing printed circuit boards, comprising:
    providing a printed circuit board substrate including a metal-clad substrate and multiple spaced circuit substrates, $\{M_i\}$, i=1, 2, ..., N, N being an integer greater than 2, the circuit substrates, $\{M_i\}$, mounted on the metal-clad substrate along an imaginary circle, the circuit substrates being equiangularly arranged about the center of the circle, the i+1th circuit substrate, $M_{i+1}$, being oriented 360/N degrees with respect to the ith neighboring circuit substrate, $M_i$;
    defining multiple processing regions, $\{K_i\}$, i=1, 2, ..., N, N being an integer greater than 2, on the metal-clad substrate, the processing regions, $\{K_i\}$, spatially corresponding to the respective circuit substrates, $\{M_i\}$;
    forming a photoresist layer on an opposite side of the metal-clad substrate to the circuit substrates, the photoresist layer including multiple photoresist layer sections, $\{P_i\}$, i=1, 2, ..., N, N being an integer greater than 2, the photoresist layer sections, $\{P_i\}$, respectively located at the processing regions, $\{K_i\}$;
    exposing the ith photoresist layer section, $P_i$, which spatially corresponds to the ith circuit substrate, $M_i$;
    rotating the printed circuit board substrate an angle of 360/N degrees about the center of the circle;
    exposing the i+1th photoresist layer section, $P_{i+1}$, which is proximate to the ith photoresist layer section, $P_i$, and spatially corresponds to the i+1th circuit substrate, $M_{i+1}$;
    developing the ith photoresist layer section, $P_i$;
    etching the metal-clad substrate at the i+1th processing region, $K_{i+1}$, to form electrically conductive patterns thereon;
    developing the i+1th photoresist layer section, $P_{i+1}$; and
    etching the metal-clad substrate at the i+1th processing region, $K_{i+1}$, to form electrically conductive patterns thereon;
    wherein the ith and i+1th photoresist layer sections, $P_i$, and $P_{i+1}$, are formed simultaneously; but the ith photoresist layer section, $P_i$, is exposed prior to that of the i+1th photoresist layer section, $P_{i+1}$.

2. The method as claimed in claim 1, wherein the metal-clad substrate includes a first insulation layer and a first electrically conductive layer, the photoresist layer is formed on the first electrically conductive layer of the metal-clad substrate, and the circuit substrates, $\{M_i\}$, are mounted on the first insulation layer of the metal-clad substrate.

3. The method as claimed in claim 1, wherein the ith photoresist layer section, $P_i$, is exposed prior to the step of developing the ith photoresist layer section, $P_i$.

4. The method as claimed in claim 1, wherein the ith photoresist layer section, $P_i$, is developed prior to the step of etching the metal-clad substrate at the ith processing region, $K_i$.

5. The method as claimed in claim 1, wherein the ith photoresist layer section, $P_i$, and the i+1th photoresist layer section, $P_{i+1}$, are developed simultaneously.

6. The method as claimed in claim 1, wherein the metal-clad substrate at the ith processing region, $K_i$, and at the i+1th processing region, $K_{i+1}$, is etched simultaneously.

7. The method as claimed in claim 1, wherein the printed circuit board substrate is rotated an angle of 360/N degrees about the center of the circle prior to exposing the i+1th photoresist layer section, $P_{i+1}$.

8. The method as claimed in claim 1, wherein the printed circuit board substrate is rotated an angle of 360/N degrees about the center of the circle after exposing the i+1th photoresist layer section, $P_{i+1}$.

9. The method as claimed in claim 1, further comprising:
    cutting the printed circuit board substrate along imaginary boundary lines between the multiple processing regions, $\{K_i\}$, to form multiple printed circuit boards, wherein the multiple printed circuit boards have a same structure.

10. The method as claimed in claim 9, further comprising:
    forming coverlayers on the multiple printed circuit boards to protect the electrically conductive patterns formed in processes of etching of the metal-clad substrate at the multiple processing regions, $\{K_i\}$.

11. The method as claimed in claim 1, wherein the circuit substrates have an identical structure.

* * * * *